United States Patent [19]

Kuo

[11] Patent Number: 5,426,398
[45] Date of Patent: Jun. 20, 1995

[54] HIGH SPEED DIFFERENTIAL MODE VOLTAGE CONTROLLED RING OSCILLATOR

[75] Inventor: James R. Kuo, Cupertino, Calif.

[73] Assignee: National Semiconductor Corporation, Santa Clara, Calif.

[21] Appl. No.: 292,919

[22] Filed: Aug. 19, 1994

[51] Int. Cl.$^6$ .................. H03B 5/02; H03K 3/354
[52] U.S. Cl. ........................ 331/57; 331/34; 331/108 A; 331/176; 331/177 R
[58] Field of Search .......... 331/34, 57, 108 A, 176, 331/177 R

[56] References Cited

U.S. PATENT DOCUMENTS

| | | | |
|---|---|---|---|
| 5,061,907 | 10/1991 | Rasmussen | 331/57 |
| 5,239,274 | 8/1993 | Chi | 331/57 |
| 5,300,898 | 4/1994 | Chen et al. | 331/57 |

OTHER PUBLICATIONS

Kim et al., "A 30–MHz Hybrid Analog/Digital Clock Recovery Circuit in 2-βm CMOS," IEEE Journal of Solid-State Circuits, vol. 25, No. 6, Dec., 1990, pp. 1385–1394.

Young et al., "WP3.3: A PLL Clock Generator With 5 to 110 MHz Lock Range for Microprocessors," ISSCC 92/ Session 3/High-Performance Circuits/Paper WP 3.3, IEEE Int'l Solid State Circuits Conference, pp. 50–51, Feb. 19, 1992.

Primary Examiner—Siegfried H. Grimm
Attorney, Agent, or Firm—H. Donald Nelson; David T. Millers; Vince Pitruzzella

[57] ABSTRACT

A differential mode voltage controlled oscillator (VCO) includes an odd number of delay cells. Each delay cell has a pair of input terminals and a pair of output terminals with the input terminals of each delay cell being connected to the output terminals of a preceding delay cell in a ring. Each delay cell has a delay time for inverting a complementary pair of signals from which a clock signal is derived. A positive temperature coefficient voltage-to-current converter receives the control voltage of the VCO and controls the maximum currents (and therefore the delays) of the delay cells. A pair of cross-coupling transistors in each delay cell keeps the signals on the output terminals out of phase (complementary). The cross-coupling transistors have sizes which maximize gain of the delay cells at the threshold voltages of the cross-couple transistor and thereby increase output voltage swing at high frequencies. The voltage at the output terminals is clamped by transistors having gates coupled to a reference cell. Gate voltage from the reference cell are supplied through a noise reduction filter which reduces jitter in the clock signal by reducing the effect of fluctuations in the supply voltage.

19 Claims, 7 Drawing Sheets

HIGH SPEED DIFFERENTIAL MODE VOLTAGE CONTROLLED RING OSCILLATOR

BACKGROUND OF THE INVENTION

1. Field of the Invention

This invention relates to voltage controlled oscillators and to integrated circuits containing voltage controlled oscillators.

2. Description of Related Art

A voltage controlled oscillator (VCO) provides an oscillating signal with frequency that depends on a control voltage. VCOs are commonly employed in phase-locked loops (PLL) such as shown in FIG. 1. In FIG. 1, a VCO 140 receives a control voltage VCNTRL from a charge pump 130 and provides an oscillating signal CLK. Signal CLK passes through a variable divider or programmable counter 150 which produces a second oscillating signal CLK2. A phase comparator 120 compares signal CLK2 to a reference signal REF generated by a reference oscillator 110 and generates control signals UP and DOWN for charge pump 130. Charge pump 130 increases, decreases, or maintains voltage VCNTRL as necessary to keep signals REF and CLK2 in phase.

FIG. 2 shows a differential mode VCO 200. VCO 200 includes an odd number of delay cells 212, 214, and 216 connected in a ring. Each delay cell inverts a pair of signals A and B as they propagate around the ring. When VCO 200 is operating properly, signals A and B are complementary, and a clock signal CLK is derived from the voltage difference between complementary oscillating signals A and B. Delay cells 212, 214, and 216 are tied to control voltage VCNTRL which controls the delay of each cell and the frequency of VCO 200. An advantage of differential mode VCO 200 is clock signal CLK being derived from a voltage difference is less affected by noise in the supply voltage.

A problem with VCO 200 is that the delay for signal A through delay cells 212, 214, and 216 can differ from the delay for signal B. In the worst case, the difference in delays causes signals A and B to become in phase, and signal CLK does not oscillate. Another problem is that VCO 200 has low differential gain at high frequencies. The speeds of delay cells 212, 214, and 216 are typically limited by gate delay for charging of transistor gates. Gate delay is a function of (C/I)dV where C is the capacitance of a transistor, I is the current charging the gate, and dV is the change in gate voltage. Lower capacitance and higher current increase speed, but also reduce the swing in output voltage and the difference between signals A and B. At high frequencies (above about 300 MHz), the output voltage may become too low to switch a standard CMOS transistor.

SUMMARY OF THE INVENTION

In accordance with an embodiment of this invention, a differential mode voltage controlled oscillator (VCO) includes an odd number of delay cells connected in a ring. Each delay cell has a pair of input terminals and a pair of output terminals with the output terminals of each delay cell being connected to the input terminals of a following delay cell in the ring. A clock signal from the VCO determined from the voltage difference between a pair of signals which propagate in parallel around the ring has a frequency determined by delays through the delay cells. A positive temperature coefficient voltage-to-current converter receives a control voltage for the VCO and controls the currents to keep the delays of the delay cells insensitive to temperature.

A pair of cross-couple transistors improves the rate of output voltage change at a transition and prevents the pair of signals from becoming in phase. A first cross-couple transistor is connected between the first output terminal and a supply terminal and has a gate connected to the second output terminal. A second cross-couple transistor is connected between the second output terminal and the supply terminal and has a gate connected to the first output terminal. Accordingly, a voltage on one of the output terminals can turn on a cross-couple transistor and keep the voltage on the other of the output terminals out of phase (complementary). The cross-couple transistors increase the gain of the delay cells near the threshold voltages of the cross-couple transistor, thereby increasing the speed of output voltage swings at high frequencies.

The voltage at the output terminals are clamped by transistors having gates coupled to a reference cell. To reduce jitter, gate voltage from the reference cell is supplied through a noise reduction filter which reduces jitter in the clock signal by reducing the effect of fluctuations in the supply voltage. Typically, the noise reduction filter is an op-amp having an output terminal coupled to one of its input terminals.

BRIEF DESCRIPTION OF THE DRAWINGS

Use of the same reference symbols in different figures indicates similar or identical items.

DETAILED DESCRIPTION OF THE PREFERRED EMBODIMENTS

Figure 1:
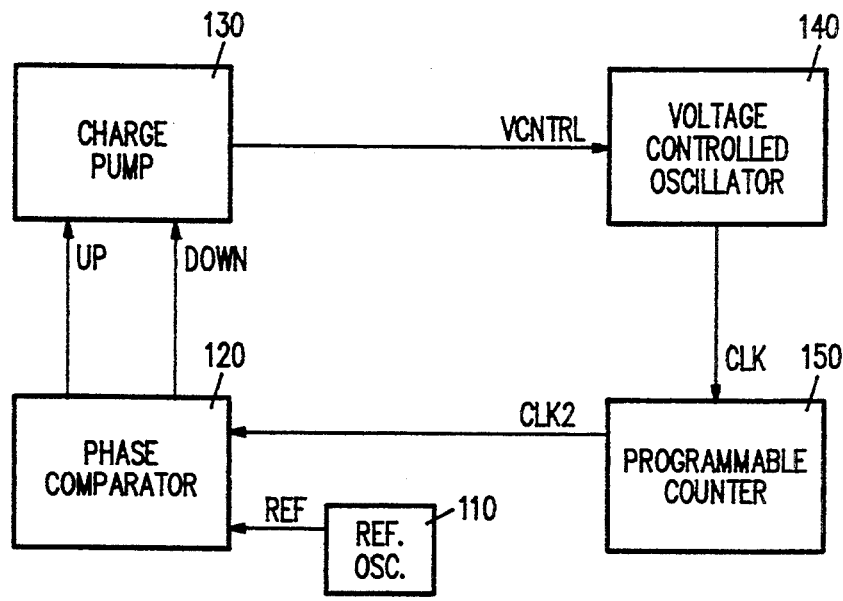
FIG. 1 shows block diagram of a prior art phase-locked loop.
Figure 2:
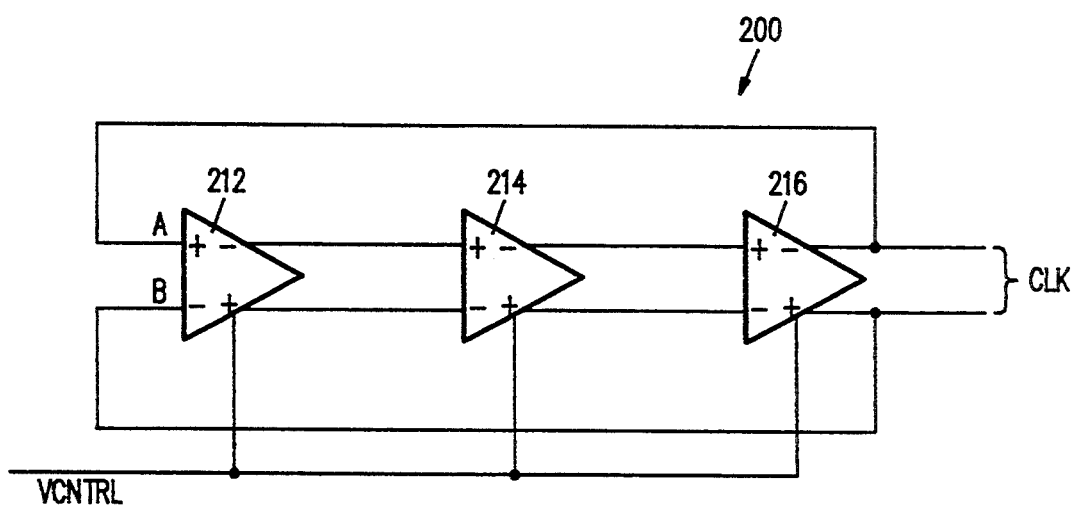
FIG. 2 shows a prior art differential mode voltage controlled oscillator.
Figure 3A:
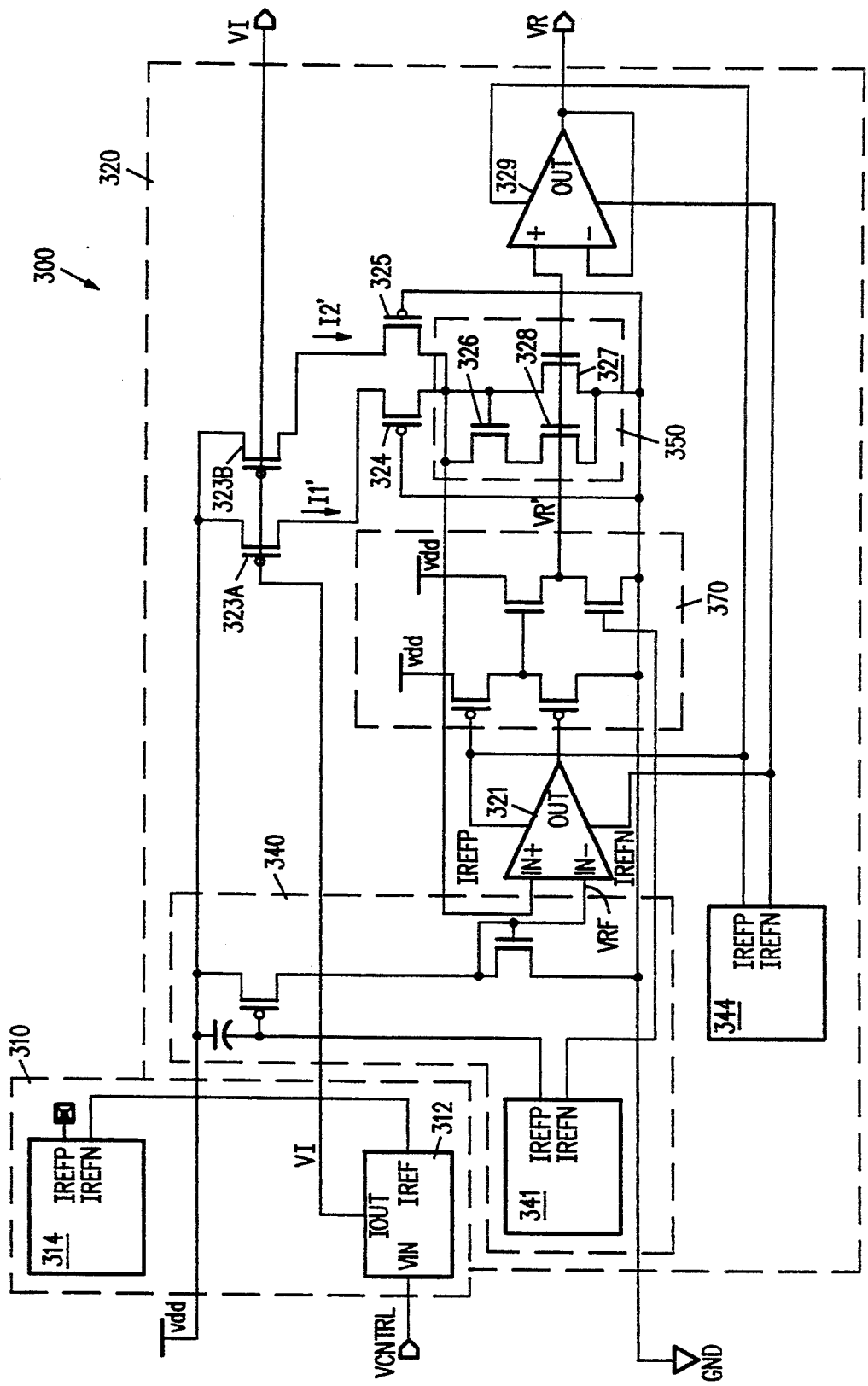
FIGS. 3A, 3B, and 3C show a schematic of a voltage controlled oscillator in accordance with an embodiment of this invention.
Figure 3B:
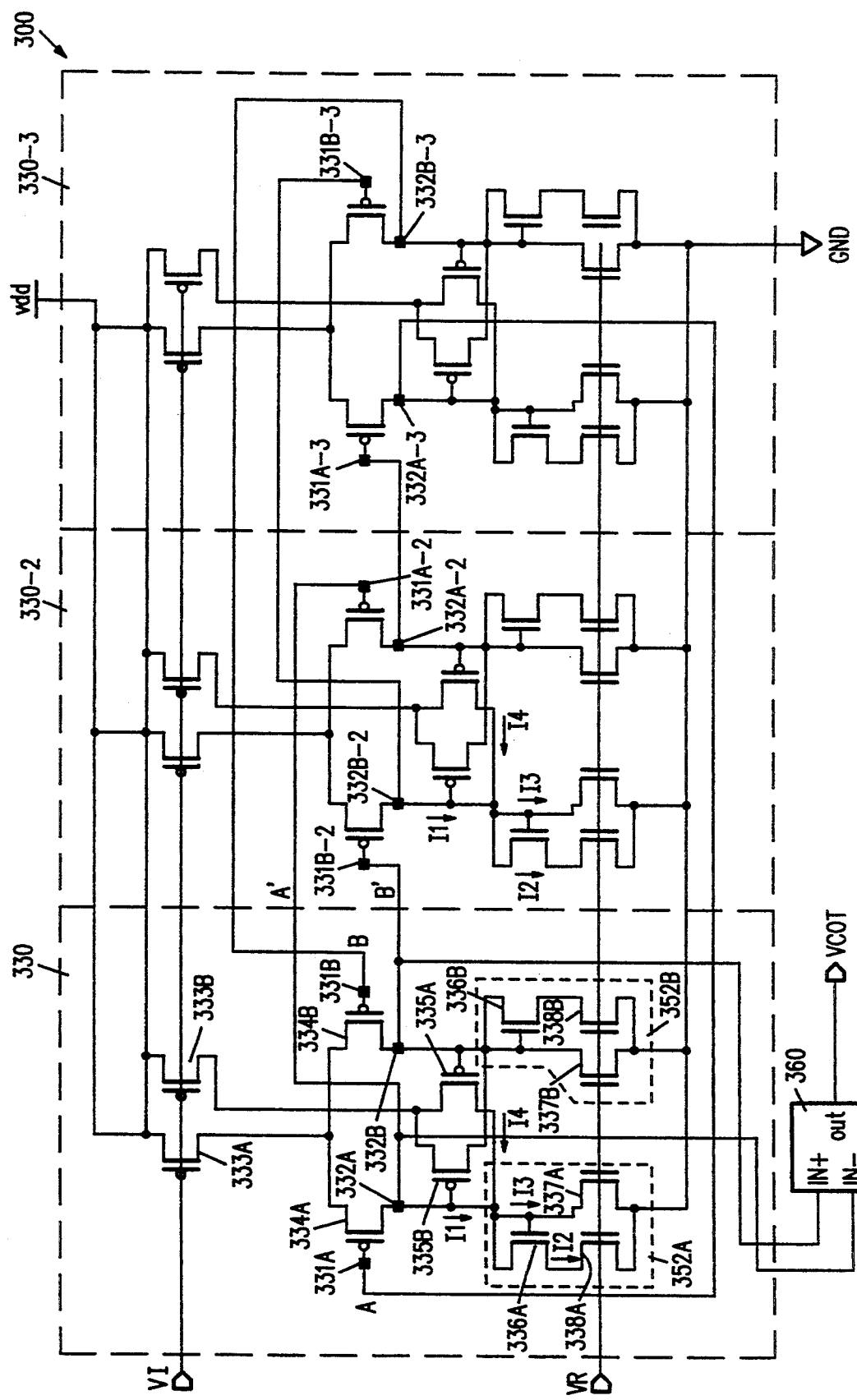
Figure 3C:
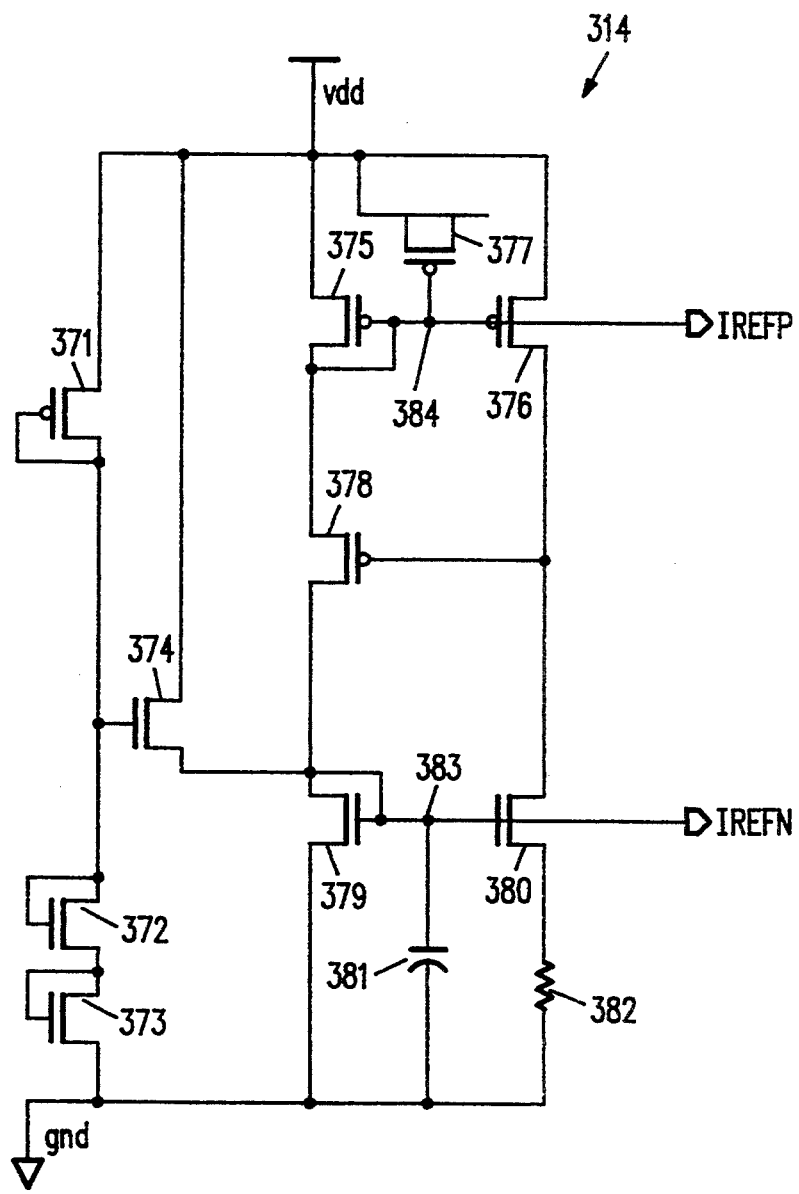

FIGS. 3A, 3B, and 3C show a schematic of a voltage controlled oscillator (VCO) 300 in accordance with an embodiment of this invention. VCO 300 includes a voltage-to-current (V-to-I) converter 310 and a reference cell 320 shown in FIG. 3A and a ring containing three identical delay cells 330, 330-2 and 330-3 shown in FIG. 3B. The following description of delay cell 330 also applies to delay cells 330-2 and 330-3.

Delay cell 330 has two input nodes 331A and 331B for input signals A and B respectively and two output nodes 332A and 332B for output signals A' and B' respectively. During normal operation, input signals A and B are complementary, that is signal A is high (low) when signal B is low (high). Delay cell 330 inverts signals A and B to provide complementary output signals A' and B'. The magnitudes of currents I1, I2, I3, and I4 in delay cell 330 determine a delay between a voltage swing in input signals A and B and an inverted voltage swing in output signals A' and B'. During operation of VCO 300, voltage swings from signals A and B propagate in parallel through delay cells 330-2 and 330-3 and return inverted to delay cell 330.

A voltage translator 360 generates a clock signal VCOT from the difference between signal A' and signal B'. For high frequency operation, signals A' and B' are restricted to voltage swings less than about 1.6 volts. Voltage translator 360 converts the differential voltage between signals A' and B' to an equal frequency signal that oscillates between Vdd and ground potential. Voltage translator 360 also sharpen edges in clock signal VCOT.

In delay cell 330, P channel cross-couple transistors 335A and 335B have gates coupled to output nodes 332B and 332A respectively and provide current to charge the opposite output node 332A and 332B respectively. If either output signal A' or B' drops, the corresponding cross-couple transistor 335A or 335B raises the other output signal B' or A' respectively. The addition of cross-couple transistors 335A and 335B provides a sharper voltage swing (greater gain) in the output signals A' and B' and cleaner edges in clock signal VCOT generated from the voltage difference between output signals A' and B'. Cross-couple transistors 335A and 335B also stop signals A' and B' from becoming in phase. Some prior art differential mode VCOs fail because output signals from delay cells can be in phase.

Delay cell 330 also includes active loads 352A and 352B attached to output nodes 332A and 332B respectively. Active loads 352A and 352B clamp the maximum voltage of output signals A' and B' and provide a nearly constant impedance. Reference cell 320 controls a gate voltage VR of transistors 337A and 337B in active loads 352A and 352B and determines the maximum voltage of signals A' and B'. An op-amp 329 in reference cell 320 acts as a noise reduction filter that reduces jitter in gate voltage VR, signals A' and B', and clock signal VCOT V-to-I converter 310 controls the maximum currents in delay cell 330, 330-2, and 330-3 and thereby controls the frequency of VCO 300 and the speed at which delay cells 330, 330-2, and 330-3 invert input signals. A temperature compensated current source 314 in V-to-I convert 310 has a positive temperature coefficient which compensates for the negative temperature coefficient of CMOS devices in VCO 300. As a result, currents in the delay cells 330, 330-2, and 330-3 and the frequency of VCO 300 are nearly independent of temperature.

FIG. 3C. shows a circuit diagram of current source 314. Current source 314 provides two output signals IREFN and IREFP which control the gate voltage of N and P channel transistors respectively so that the current through the N or P channel transistors change in accordance with the positive temperature coefficient of current source 314. The relative size of transistors 379 and 380 control the magnitude of the positive temperature coefficient. Appropriate sizes for a particular embodiment are determined using standard numerical circuit simulations. In one embodiment, transistors 379 and 380 have channel widths of 400 $\mu$m and 2000 $\mu$m respectively and equal channel lengths.

Transistors 379 and 380 have gates coupled together and to a capacitor 381 and a transistor 374 at a node 383. During power-up when voltage Vdd is increasing, transistor 374 conducts and charges node 383. Transistors 371 to 373 control the gate voltage of transistor 374 so that when signal IREFN is in its normal voltage range transistor 374 is off, and a current through transistor 379 equals the current through transistors 375 and 378. Transistor 375 has gate and drain coupled together so that current in a P channel transistor controlled by signal IREFP varies in the same manner as current in an N channel transistor controlled by signal IREFN.

Transistor 378 forms a Wilson current mirror and increases the output impedance of current source 314. Capacitor 377 and 381 reduce noise in signals IREFP and IREFN. The sizes of transistors 375, 376, and 378 are selected according to the desired current through current source 314.

A positive temperature coefficient arises because the gate-drain voltage of transistor 379 equals the gate-drain voltage of transistor 380 plus the voltage across a resistor 382. Accordingly, the voltage drop across resistor 382 equals the difference in the gate-drain voltages of transistors 379 and 380. By making transistor 380 larger than transistor 379, signal IREFN increases with temperature creating a positive temperature coefficient for current source 314.

VCO 300 includes a ring of three delay cells 330, 330-2, and 330-3. Alternatively, a ring may have any other odd number of delay cells. Delay cells 330, 330-2, and 330-3 have input nodes 331A and 331B, 331A-2 and 331B-2, and 331A-3 and 331B-3 respectively coupled to output nodes 332A-3 and 332B-3, 332A and 332B, and 332A-2 and 332B-2 of a preceding delay cell 330-3, 330, and 330-2 in the ring.

Delay cell 330 has two interconnected sections. One section inverts signal A. The other section inverts signal B. Signals A and B are approximately complementary and oscillate with a frequency that depends on the switching speeds of delay cells 330, 330-2, and 330-3. The switching speed of delay cell 330 depends on currents I1, I2, I3, and I4. A P channel transistor 333A controls the maximum magnitude of current I1 which flows through a P channel transistor 334A in the section of delay cell 330 that inverts signal A. When signal A is low, current I1 flows through transistor 334A to output node 332A. A P channel transistor 333B controls the maximum of a current I4 which flows through cross-couple transistor 335A to output node 332A. When signal B' is low, transistor 335A conducts and current I4 charges output node 332A. The speed at which signal A' rises when signal A drops and signal B rises is determined by the net current (I1+I4−I2−I3) into node 332A and the capacitance of delay cell 330 and other devices attached to node 332A.

V-to-I converter 310 varies a gate voltage VI applied to transistors 333A and 333B, so that currents I1 and I4 (and therefore the frequency of VCO 300) depend on a control voltage VCNTRL. Typically, a charge pump in a phase-locked loop provides control voltage VCNTRL and thereby controls the frequency of clock signal VCOT. U.S. patent application Ser. No. 08/275,575, entitled "CHARGE PUMP WITH NEAR ZERO OFFSET CURRENT", filed Jul. 15, 1994, by James R. Kuo discloses such a charge pump and is incorporated by reference herein in its entirety.

V-to-I converter 310 contains current source 314 that provides reference signal IREFN to a current divider 312 that provides gate voltage VI. The magnitude of voltage VI depends on reference signal IREFN and control voltage VCNTRL. Current source 314 has a positive temperature coefficient selected so that signal IREFN increases with temperature. Increases in signal IREFN cause current divider 312 to change voltage VI so that the delays of delay cells 330, 330-2, and 330-3 remain insensitive to temperature.

Active load 352A in delay cell 330 includes N channel transistors 336A, 337A, and 338A which connect node 332A to ground. Transistor 337A and 338A have gates coupled to reference cell 320. Reference cell 320 controls gate voltage VR of transistors 337A and 338A and the impedance of active load 352A. Active load 352A keeps output signal A' at less than a fixed voltage. In a typical embodiment where Vdd is about 5 volts, transistor 337A limits output signal A' to less than about 1.6 volts. Accordingly, the maximum voltage swing is limited and permits higher frequency operation.

The section of delay cell 330 which inverts signal B contains an active load 352B and transistors 334B and 335B which are identical to active load 352A and transistors 334A and 335A respectively. The operation and function of the section which inverts signal B is the same as described herein for corresponding elements in the section that inverts signal A.

As disclosed above, reference cell 320 generates gate voltage VR for transistors 337A, 338A, 337B, and 338B and thereby limits the voltage of output signals A' and B' to less than a fixed maximum voltage. Reference cell 320 includes: transistors 323A and 323B which are identical to transistors 333A and 333B respectively and have gate voltage VI provided by V-to-I converter 310 as do transistors 333A and 333B; and transistors 324, 325, 326, 327, and 328 which are identical to transistors 334A, 335A, 336A, 337A, and 338A respectively (and also to corresponding transistors 334B, 335B, 336B, 337B, and 338B respectively). Transistors 323A, 323B, 324, 325, 326, 327, and 328 are connected in the same manner as the sections of delay cell 330 disclosed above, except that transistors 324 and 325 have gates coupled to ground. Transistors 334A and 335A have gates voltages which are signals A and B' respectively. In delay cell 330, signal A' is at its maximum voltage when signals A and B' are low (grounded). Accordingly, reference cell 320 conducts currents I1' and I2' which equal the respective maximums of currents I1 and I2, and the voltage on node 322 equals the maximum voltage of signal A'. Similarly, the voltage on node 322 equals the maximum of signal B' (the maximum voltage on node 332B) if transistors 327 and 328 have the same gate voltages as transistors 337B and 338B.

In reference cell 320, an op-amp 321 has a positive input terminal coupled to node 322, a negative input terminal coupled to a voltage source 340, and an output terminal coupled through a buffer 370 to the gate of transistor 327. A current source 344 controls current in op-amp 321, buffer 370, and op-amp 329. Current source 344 has a positive temperature coefficient and is the same as current source 314 shown in FIG. 3C. Op-amp 321 acts as a comparator which compares the voltage on node 322 to a reference voltage VRF provided by a voltage source 340. Voltage source 340 uses a current source 341 which controls current through a pair of transistors 342 and 343 to generate reference voltage VRF. Current source 341 has a positive temperature coefficient and is the same as current source 314 shown in FIG. 3C. Many other types of voltage source may replace voltage source 340. Op-amp 321 provides via buffer 370 a voltage VR'. Buffer 370 stabilizes signal VR' and reduces the impedance for op-amp 321. Voltage VR' applied to active load 350 keeps the voltage at node 322 about equal to reference voltage VRF.

Op-amp 329 has positive input terminal coupled to the gate of transistor 327 to receive voltage VR' and a negative input terminal and an output terminal coupled together. The gates of transistors 337A, 338A, 337B, and 338B in delay cell 330 are coupled to the output terminal of op-amp 329. Similarly, gates of transistors in delay cells 330-2 and 330-3 are coupled to the output terminal of op-amp 329 in reference cell 320. Op-amp 329 provides voltage VR that is about equal to gate voltage VR', but op-amp 329 filters noise so that voltage VR applied to transistors 337A, 338A, 337A, and 338B is less noisy than voltage VR'. Such noise is typically the result of fluctuations in supply voltage Vdd caused by current changes in inductive bond wires. Noise from supply voltage Vdd is filtered by op-amp 329 because the positive input terminal is coupled to reference cell 320 and the negative input terminal is coupled in a similar manner to delay cells 330, 330-2, and 330-3. The noises on the positive and negative inputs terminals are similar and tend to cancel each other in op-amp 329. Filtering out this noise reduces jitter in the speed of delay cell 330 and jitter in the frequency of VCO 300.

In delay cell 330, active load 352A couples to node 332A and conducts currents I2 and I3 which discharge node 332A. FIG. 4C shows plots of currents I2 and I3 and the sum of currents I2 and I3 as a function of the voltage level of signal A'. As shown, the sum of currents I2 and I3 linearly increases with the voltage of signal A'. Current I2 is small when signal A' is less than the threshold voltage of transistor 336A. Above the threshold voltage of transistor 336A, current I2 is determined by the effective resistance of transistors 336A and 338A. Current I3 plateaus as transistor 337A reaches saturation.

Figure 4A:
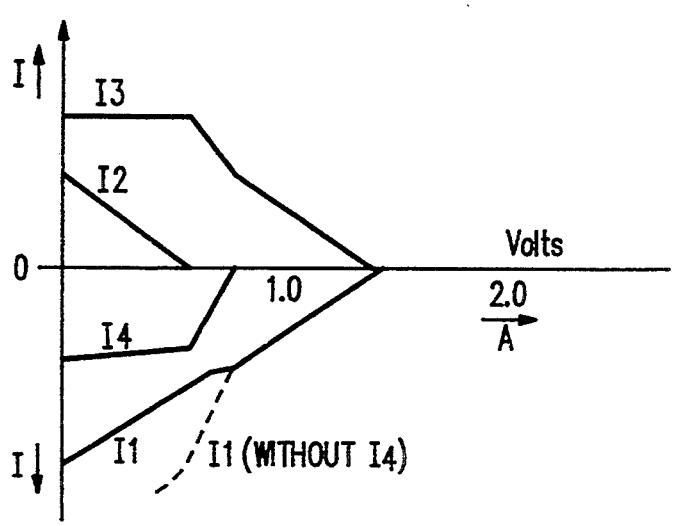
FIGS. 4A, 4B, and 4C show plots relating input signal A, output signal A', and currents I1, I2, I3, and I4 in delay cells of the embodiment of FIGS. 3A, 3B, and 3C.
Figure 4B:
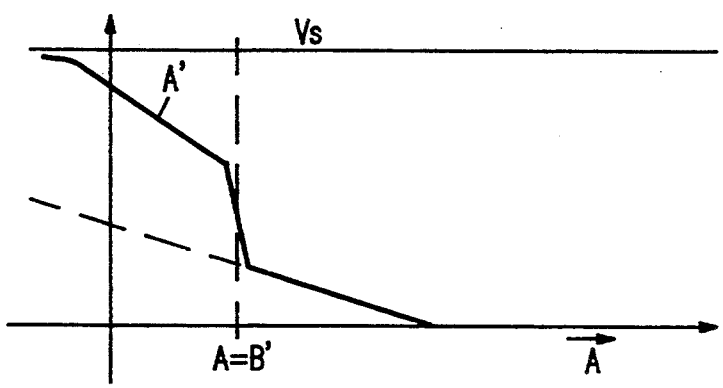
Figure 4C:
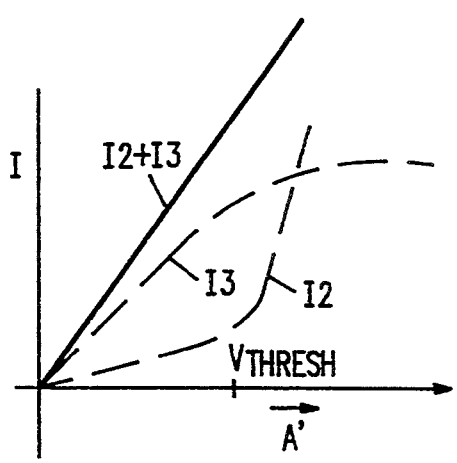

FIGS. 4A and 4B illustrate how currents I1 to I4 and voltage A' vary with changes in signal A. When signals A and B' are about 1.6 volts, transistors 334A and 335A are off; currents I1 to I4 are zero; and signal A' is grounded. As the voltage of signal A decreases, transistor 334A begins turning on and current I1 and the voltage of signal A' increase at a rate characteristic of transistor 334A. Meanwhile, signal B' on node 332B decreases. When the voltage difference between signals A' and B' nears the threshold voltage of cross-couple transistor 335A, current I4 begins to flow. The gain for signal A' is greatest in this region because both transistors 334A and 335A conduct currents I1 and I4 into node 332A but only transistor 337A conducts current I3 out of node 332A. Current I2 out of node 332A is almost zero until the voltage of signal A' is high enough that transistors 336A and 338A in active load 352A conduct. At this point, the gain in signal A' decreases.

An important feature of this embodiment of the invention is the high gain near the threshold voltage of cross-couple transistors 335A and 335B. The high gain provides a sharper edge during voltage swings of signals A' and B'. In order to maximize gain, transistor 335A should have a size selected so that the rate of increase in current I4 with decreasing voltage B', near the threshold voltage of transistor 335A matches the rate of increase of current I3 with increasing voltage A'. When the change in current I4 equals the change in current I3, and I2 is about zero, a relatively small increase in current I1 (and therefore in the net current into node 332A) causes a relatively large increase in the voltage at node 332A. The size for transistor 335A in a particular embodiment depends on the sizes of the other transistors in delay cell 330 and can be determined using standard numerical simulations. Transistor 335B has the same size as transistor 335A.

Figure 5:
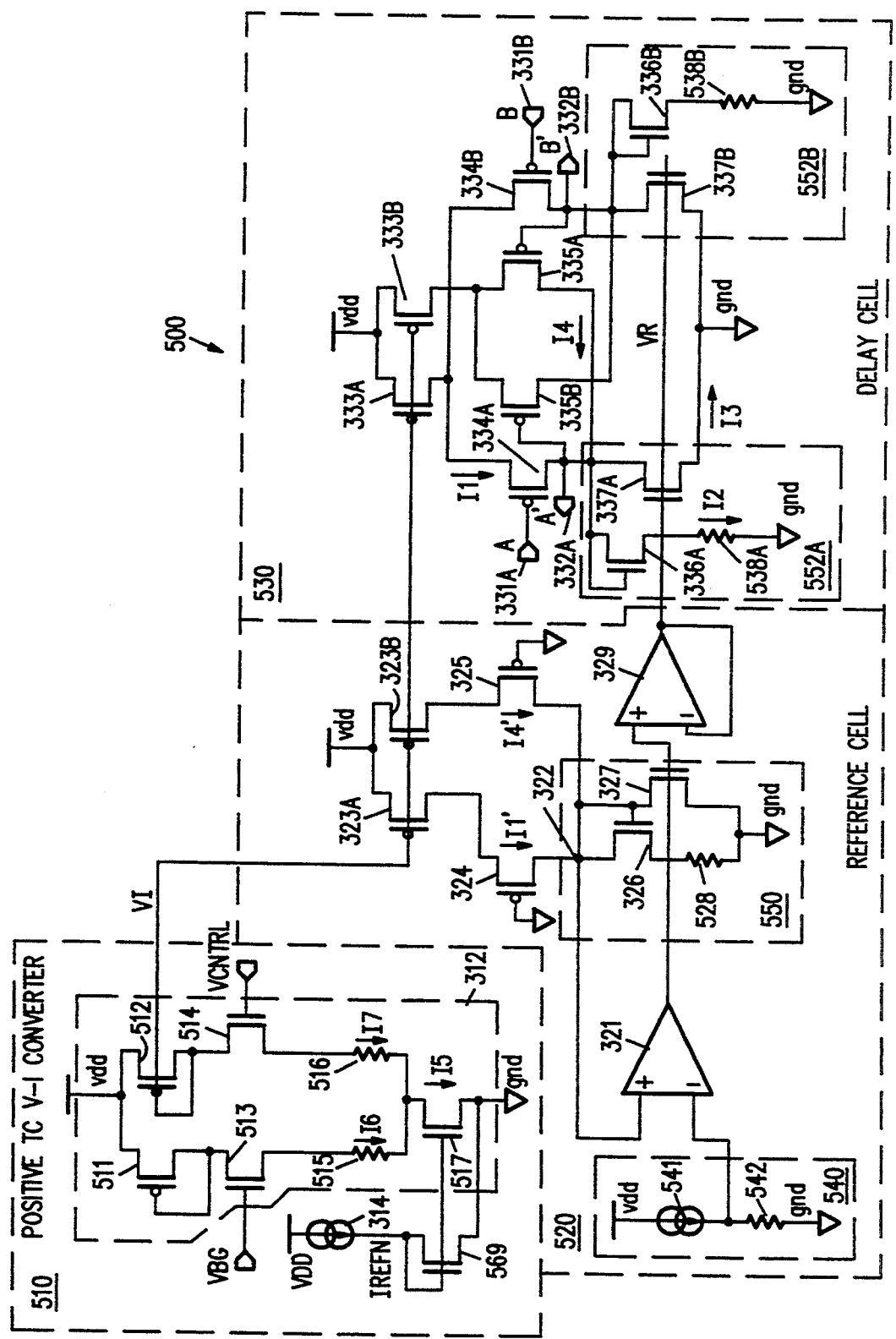
FIG. 5 shows a circuit diagram of a portion of a voltage controlled oscillator in accordance with an embodiment of this invention.

FIG. 5 shows a circuit diagram of a portion of a VCO 500 in accordance with another embodiment of this invention. The portion shown contains only a single delay cell 530. In a typical VCO, the number of delay cells would be an odd number greater than one. FIG. 5 contains elements which are similar or identical to those shown in FIGS. 3A and 3B. The above disclosure in regard to FIGS. 3A and 3B applies to the elements having the same reference symbols in FIG. 5.

In the embodiment of FIG. 5, delay cell 530 differs from delay cell 330 in that transistors 338A and 338B (FIG. 3B) are replaced by resistors 538A and 538B (FIG. 5). Resistors 538A and 538B have fixed resistance which can not be changed by a reference cell 520. Reference cell 520 controls the resistance of active loads 552A and 552B and the maximum output signals A' and B' through a gate voltage VR of transistors 337A and 337B respectively.

Reference cell 520 includes a resistor 528 which has the same resistance as resistors 538A and 538B so that reference cell 520 matches a section of delay cell 530. Reference cell 520 further differs from reference cell 320 in FIG. 3A by directly coupling the output of op-amp 321 to the input of op-amp 329 without intervening buffer 370. Still a further difference is a voltage source 540 which contains a current source 541 and a resistor 542 (FIG. 5) replaces voltage source 340 (FIG. 3A).

V-to-I converter 510 provides a gate voltage VI which controls the maximum magnitude of currents in reference cell 520 and delay cell 530. V-to-I converter 510 contains a current source 314 connected to a current divider 312. Current source 314 has a positive temperature coefficient which compensates for the negative current coefficient of transistors in VCO 500 so that the frequency of VCO 500 remains nearly constant over the range of operating temperatures. The positive temperature coefficient is controlled and determined as described above in regard to FIG. 3C.

N channel transistor 569 has a gate coupled to current source 314 and to a gate of an N channel transistor 517 so that a current I5 through transistor 517 is proportional to the current through transistor 569. Current I5 is the sum of currents I6 and I7 in two parallel legs which connect transistor 517 to supply voltage Vdd. A first of the two legs contains a transistor 511, a transistor 513, and resistor 515 in series. A second leg of the two legs contains a transistor 512, a transistor 514, and a resistor 516 in series. The components 511, 513, and 515 are identical to corresponding components 512, 514, and 516. The two legs differ in that a reference voltage VBG fixes the gate voltage of transistor 513, but the gate voltage of transistor 514 varies with voltage VCNTRL. A voltage source such as a bandgap voltage generator provides reference voltage VBG (typically about 1.6 volts). Control voltage VCNTRL is typically provided by a charge pump such as disclosed in the U.S. patent application entitled "CHARGE PUMP WITH NEAR ZERO OFFSET CURRENT" by James R. Kuo incorporated by reference above.

Changes in voltage VCNTRL change the resistance of transistor 514, currents I6 and I7, voltage VI, and the currents in delay cell 530. When voltage VCNTRL is greater than voltage VBG, the resistance of transistor 514 is less than the resistance of transistor 513, and current I7 is greater than current I6. When voltage VCNTRL is less than voltage VBG, the resistance of transistor 514 is greater than the resistance of transistor 513, and current I7 is less than current I6. Transistor 512 has a gate coupled to its drain and to transistors 323A, 323B, 333A, and 333B so that transistors 323A, 323B, 333A, and 333B mirror current I7 in transistor 512.

To maintain a constant delay in delay cell 330, voltage VI must drop to compensate for the negative temperature coefficient circuit elements and stop the current through transistors 323A, 323B, 333A, and 333B from falling. Typically, current through transistors 333A and 333B must increase with temperature to compensate for slower switching speed in delay cell 330. The correct positive temperature coefficient for current source 314 may be determined using computer simulations of VCO 500.

Figure 6:
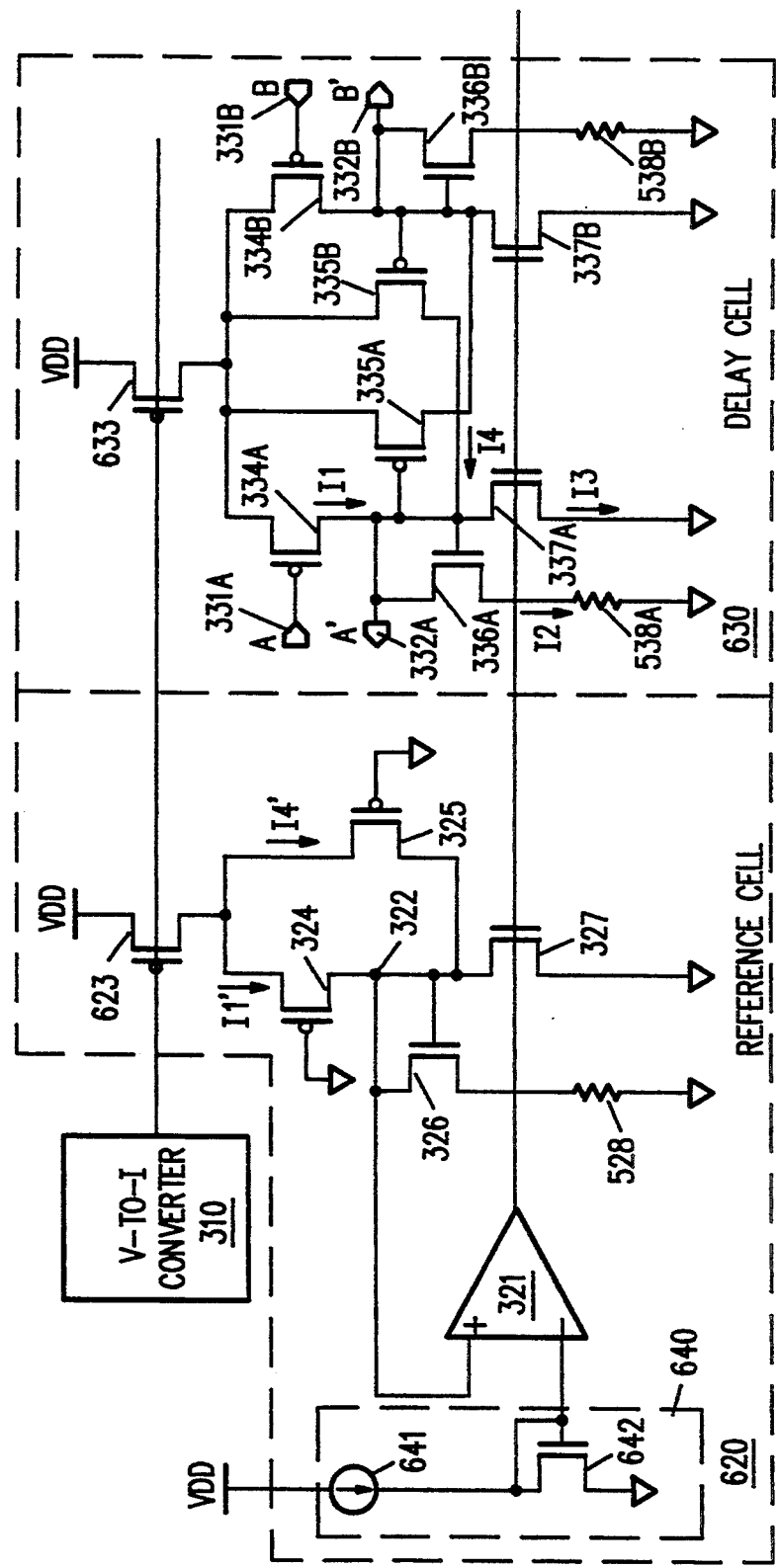
FIG. 6 shows a circuit diagram of a portion of a voltage controlled oscillator in accordance with another embodiment of this invention.

FIG. 6 shows a circuit diagram of a portion of a VCO in accordance with another embodiment of this invention. Elements in FIG. 6 marked with the same reference symbols as elements in FIGS. 3A and 3B or 5 are similar or identical to the elements disclosed above. A delay cell 630 in the embodiment of FIG. 6 differs from the above-disclosed delay cells 330 and 530 in that a single P channel transistor 633 controls the maximum currents through transistors 334A, 334B, 335A, and 335B.

A reference cell 620 differs from the above-disclosed reference cells 320 and 520 in a similar manner (a single P channel transistor 623 controls the maximum of currents I1' and I4') so that reference cell 620 matches the structure of a section of delay cell 630. Reference cell 620 also differs from the above-disclosed reference cells 320 and 520 in that op-amp 321 provides a gate voltage to 337A and 337B without an intervening noise reduction buffer (op-amp 329 in FIGS. 3A and 5). Additionally, resistor 542 in voltage source 540 of FIG. 5 is implemented as a transistor 642 in voltage source 640 of FIG. 6.

Although the present invention has been described with reference to particular embodiments, the description is only an example of the invention's application and should not be taken as a limitation. Many other embodiments in accordance with this invention are possible. In particular, transistor types and voltage polarities described for any of the above embodiment may be reversed. Various other adaptations and combinations of features of the embodiments disclosed will be apparent to those skilled in the art and are within the scope of the present invention as defined by the following claims.

I claim:

1. A voltage controlled oscillator, comprising an odd number of delay cells, each delay cell having first and second input terminals and first and second output terminals, the delay cells being connected in a loop with the input terminals of each cell connected to the output terminals of a preceding cell in the loop, wherein each delay cell further comprises:

a first transistor connected between a first voltage terminal and the first output terminal, the first transistor having a gate coupled to the first input terminal;

a second transistor connected between the first voltage terminal and the second output terminal, the second transistor having a gate coupled to the second input terminal;

a third transistor connected between the first voltage terminal and the first output terminal, the third transistor having a gate coupled to the second output terminal; and a fourth transistor connected between the first voltage terminal and the second output terminal, the fourth transistor having a gate coupled to the first output terminal.

2. The voltage controlled oscillator of claim 1, further comprising a voltage-to-current converter, wherein:

each delay cell further comprises a fifth transistor connected in series with the first transistor and the first voltage terminal, a gate of the fifth transistor being coupled to the voltage-to-current converter; and the voltage-to-current converter asserts a gate voltage to the fifth transistor of each delay cell and thereby limits currents in the delay cells.

3. The voltage controlled oscillator of claim 2, wherein each delay cell further comprises a sixth transistor connected between the third transistor and the first voltage terminal, a gate of the sixth transistor is coupled to the voltage-to-current converter, and the voltage-to-current converter asserts a gate voltage to the sixth transistor.

4. The voltage controlled oscillator of claim 2, wherein the voltage-to-current converter changes the gate voltage to the fifth transistor to prevent currents in the delay cells from falling when a temperature increases.

5. The voltage controlled oscillator of claim 2, wherein the voltage-to-current converter has a positive temperature coefficient.

6. The voltage controlled oscillator of claim 5, further comprising:

a first load connected between the first output terminal and a second voltage terminal; and a second load connected between the second output terminal and the second voltage terminal.

7. The voltage controlled oscillator of claim 6, further comprising a reference cell, wherein:

the first load of each delay cell comprises a sixth transistor coupled between the first output terminal and the second voltage terminal;

the second load of each delay cell comprises a seventh transistor coupled between the second output terminal and the second voltage terminal; and the reference cell controls gate voltages of the transistor in the first load and the transistor in the second load of each delay cell to limit voltages on the first and second output terminals.

8. The voltage controlled oscillator of claim 7, wherein the reference cell comprises a noise buffer coupled to the gates of the transistors in the first and second loads of each delay cell.

9. The voltage controlled oscillator of claim 7, further comprising an op-amp connected between the reference cell and the first and second loads of the delay cells, the op-amp having a positive input terminal, a negative input terminal, and an output terminal, wherein:

one of the input terminals of the op-amp is coupled to the reference cell;

the other of the input terminals of the op-amp is coupled to the output terminal of the op-amp; and the output terminal of the op-amp is coupled to the gates of the sixth and seventh transistor of each delay cell.

10. The voltage controlled oscillator of claim 1, further comprising:

a first load connected between the first output terminal and a second voltage terminal; and a second load connected between the second output terminal and the second voltage terminal.

11. The voltage controlled oscillator of claim 10, further comprising a reference cell, wherein:

the first load of each delay cell comprises a sixth transistor coupled between the first output terminal and the second voltage terminal;

the second load of each delay cell comprises a seventh transistor coupled between the second output terminal and the second voltage terminal; and the reference cell controls gate voltages of the sixth and seventh transistors of each delay cell to limit voltages on the first and second output terminals.

12. The voltage controlled oscillator of claim 11, further comprising an op-amp connected between the reference cell and the first and second loads of the delay cells, the op-amp having a positive input terminal, a negative input terminal, and an output terminal, wherein:

one of the input terminals of the op-amp is coupled to the reference cell;

the other of the input terminals of the op-amp is coupled to the output terminal of the op-amp; and the output terminal of the op-amp is coupled to the gates of the sixth and seventh transistor of each delay cell.

13. A voltage controlled oscillator, comprising:

an odd number of delay cells connected in a loop, each delay cell comprising:

first and second input terminals and first and second output terminals, the input terminals being connected to the output terminals of a preceding cell in the loop;

a first transistor connected between a first voltage terminal and the first output terminal, the first transistor having a gate coupled to the first input terminal;

a second transistor connected between the first voltage terminal and the second output terminal, the second transistor having a gate coupled to the second input terminal;

a third transistor coupled between the first output terminal and a second voltage terminal; and a fourth transistor coupled between the second output terminal and the second voltage terminal;

a reference cell which controls gate voltages of the third and fourth transistors of each delay cell to limit voltages on the first and second output terminals; and an op-amp having a positive input terminal, a negative input terminal, and an output terminal, wherein one of the input terminals of the op-amp is coupled to the reference cell, the other of the input terminals of the op-amp is coupled to the output terminal of the op-amp, and the output terminal of the op-amp is coupled to the gates of the third and fourth transistors of each delay cell.

14. The voltage controlled oscillator of claim 13, further comprising a voltage-to-current converter, wherein:

each delay cell further comprises a fifth transistor connected between the first transistor and the first voltage terminal, a gate of the fifth transistor being coupled to the voltage-to-current converter; and the voltage-to-current converter asserts a gate voltage to the fifth transistors of each delay cell and limits current through the fifth transistor in each delay cell.

15. The voltage controlled oscillator of claim 14, wherein:

each delay cell further comprises a sixth transistor connected between the second transistor and the first voltage terminal, a gate of the sixth transistor being coupled to the voltage-to-current converter; and the voltage-to-current converter asserts a gate voltage to the sixth transistor of each delay cell.

16. The voltage controlled oscillator of claim 14, wherein the voltage-to-current converter changes the gate voltage to the fifth transistor to prevent currents in the delay cells from falling when a temperature increases.

17. The voltage controlled oscillator of claim 14, wherein the voltage-to-current converter has a positive temperature coefficient.

18. A voltage controlled oscillator, comprising:

an odd number of delay cells which invert an input signal after a delay which depends on a current in each delay cell, the delay cells being connected in a loop with an input terminal of each delay cell being connected to an output terminal of a preceding delay cell in the loop;

a plurality of transistors, wherein each transistor is coupled between a corresponding one of the delay cells and a first voltage terminal, and a gate voltage applied to the transistors controls the current in the corresponding delay cells; and a voltage-to-current converter which changes the gate voltage of the transistors to prevent currents in the delay cells from falling when a temperature increases.

19. The voltage controlled oscillator of claim 18, further comprising a second plurality of transistors, wherein:

each transistor in the second plurality is coupled between a corresponding one of the delay cells and the first voltage terminal and has a gate coupled to the voltage-to-current converter;

each transistor controls a second current in the corresponding delay cell;

the delay of each delay cell depends on the second current in the delay cell; and the voltage-to-current converter changes the gate voltage of the second plurality of transistors to prevent the second currents in the delay cells from falling when a temperature increases.

* * * * *

UNITED STATES PATENT AND TRADEMARK OFFICE
CERTIFICATE OF CORRECTION

PATENT NO.  :   5,426,398
DATED       :   June 20, 1995
INVENTOR    :   James R. Kuo It is certified that error appears in the above-identified patent and that said Letters Patent is hereby corrected as shown below:

Col. 5, line 4, delete "Transistor" and insert --Transistors--.

Col. 5, line 36, delete "gates" and insert --gate--.

Signed and Sealed this

Twelfth Day of December, 1995

Attest:

BRUCE LEHMAN

*Attesting Officer*               *Commissioner of Patents and Trademarks*